(12) United States Patent
Chiu

(10) Patent No.: US 7,039,146 B2
(45) Date of Patent: May 2, 2006

(54) METHOD AND INTERFACE FOR GLITCH-FREE CLOCK SWITCHING

(75) Inventor: Kenny Kok-Hoong Chiu, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 837 days.

(21) Appl. No.: 09/760,560

(22) Filed: Jan. 16, 2001

(65) Prior Publication Data
US 2002/0135408 A1 Sep. 26, 2002

(51) Int. Cl.
H03D 3/24 (2006.01)
H04L 7/00 (2006.01)
G06F 1/12 (2006.01)

(52) U.S. Cl. ............... 375/373; 375/354; 713/400
(58) Field of Classification Search .......... 327/99–147; 375/354, 357, 371, 373, 360, 355, 356; 370/282–507, 370/358; 713/500–600, 400; 714/744; 340/825.5
See application file for complete search history.

(56) References Cited

U.S. PATENT DOCUMENTS

| | | | | |
|---|---|---|---|---|
| 4,398,155 A * | 8/1983 | Atwell et al. | .......... | 327/144 |
| 5,294,842 A * | 3/1994 | Iknaian et al. | .......... | 327/144 |
| 5,371,880 A * | 12/1994 | Bhattacharya | .......... | 713/400 |
| 5,502,409 A * | 3/1996 | Schnizlein et al. | .......... | 327/99 |
| 5,517,638 A * | 5/1996 | Szczepanek | .......... | 713/401 |
| 5,675,615 A * | 10/1997 | Watt | .......... | 375/354 |
| 5,790,609 A * | 8/1998 | Swoboda | .......... | 375/357 |
| 5,903,746 A * | 5/1999 | Swoboda et al. | .......... | 713/501 |
| 5,987,620 A * | 11/1999 | Tran | .......... | 713/600 |
| 6,107,841 A * | 8/2000 | Goodnow | .......... | 327/99 |
| 6,239,626 B1 * | 5/2001 | Chesavage | .......... | 327/99 |
| 6,266,780 B1 * | 7/2001 | Grundvig et al. | .......... | 713/501 |
| 6,275,546 B1 * | 8/2001 | Miller et al. | .......... | 375/354 |
| 6,292,038 B1 * | 9/2001 | Stachura et al. | .......... | 327/145 |
| 6,292,044 B1 * | 9/2001 | Mo et al. | .......... | 327/298 |
| 6,310,822 B1 * | 10/2001 | Shen | .......... | 365/233 |
| 6,324,652 B1 * | 11/2001 | Henderson et al. | .......... | 713/500 |
| 6,349,391 B1 * | 2/2002 | Petivan et al. | .......... | 714/11 |
| 6,434,640 B1 * | 8/2002 | Keller | .......... | 710/52 |
| 6,738,442 B1 * | 5/2004 | Wilcox | .......... | 375/360 |
| 6,782,064 B1 * | 8/2004 | Schwake | .......... | 375/354 |

OTHER PUBLICATIONS

*MC68302 Integrated Multiprotocol Processor User's Manual*; Motorola, 1995, cover pages, table of contents, and pp. 4-16 through 4-19, and E17 through E19.
*ITU-T Telecommunication Standarization Sector of ITU*, International Telecommunication Union, 1988, 1993, cover pages and pp. 1-3.
*Reference Data Sheet, T7237 ISDN U-Interface Transceiver*, AT&T Microelectronics, Mar. 1996, pp. 49-52.

(Continued)

*Primary Examiner*—Emmanuel Bayard
*Assistant Examiner*—Lawrence B. Williams
(74) *Attorney, Agent, or Firm*—Akin Gump Strauss Hauer & Feld, LLP

(57) ABSTRACT

A clock switching technique allows selecting an input clock signal from two clock sources. The two clock sources are asynchronous to one another and a clock select signal is used to determine which of the clocks will be switched onto the clock output line. The clock select signal is asynchronous to both clock sources and can be either from a programmable bit implemented under software control or as a single signal generated from some other logic block. The technique guarantees that the switching to the desired clock based on the binary value of the clock select signal onto the clock line is glitch-free. The clock switching technique is independent of the two clock source frequencies as well as the system clock frequency.

25 Claims, 7 Drawing Sheets

OTHER PUBLICATIONS

*Using the AM186™ES and AM188™ES Microcontrollers in Communications Applications*, Advanced Micro Devices, Inc., Apr. 2, 1997.

*AM186™EM and AM188™EM Microcontrollers User's Manual*, Advanced Micro Devices, Inc., pp. i through viii, 9-1 through 9-13, and 11-1 through 11-8.

* cited by examiner

METHOD AND INTERFACE FOR GLITCH-FREE CLOCK SWITCHING

CROSS-REFERENCE TO RELATED APPLICATIONS

Not applicable.

STATEMENT REGARDING FEDERALLY SPONSORED RESEARCH

Not applicable.

BACKGROUND OF THE INVENTION

1. Field of the Invention

The invention relates to microcontrollers and computer systems, and more particularly to microcontrollers which need to select a clock from a variety of possible clock sources.

2. Description of the Related Art

Specialized microcontrollers with integrated communication features are becoming particularly attractive for communications applications. A microcontroller, or an embedded controller, is uniquely suited to combining functionality onto one monolithic semiconductor substrate (i.e. chip). By embedding various communication features within a single chip, a communications microcontroller may support a wide range of communication applications.

Microcontrollers have been used for many years in many applications. A number of these applications involve communications over electronic networks, such as telephone lines, computer networks, and local and wide area networks, in both digital and analog formats. In communications applications, a microcontroller generally has a number of integrated communications peripherals in addition to the execution unit. These can be low and high speed serial ports, as well as more sophisticated communications peripherals, such as a universal serial bus (USB) interface, and high level data link control (HDLC) channels.

For high-speed communications that use frames of data, HDLC channels are especially well suited. An HDLC channel transmits and receives frames based on the HDLC format. This format uses flags to determine the start and stop of a frame, and uses "bit stuffing" to maintain data transparency. An HDLC channel, however, is a general purpose device, and can be employed to implement a number of communications protocols, such as the serial circuit interface (GCI) protocol (similar to an IOM-2 protocol) sometimes used for ISDN (integrated services digital network) communications (similar to the IOM-2 protocol), a pulse coded modulation (PCM) highway protocol, as well as raw data communications equipment (DCE) formats. These formats are synchronous communication protocols that may or may not include a separate clock.

But communications employing the HDLC format can be further implemented within time slots of a lower level time division multiplexed framing protocol, such as a T1 or E1 protocol. This protocol employs 24 or 32 time slots of 8 bits each, and each time slot could be used to carry different communications data, even in different formats. In such protocols, the time slots are determined based on a frame sync signal, which can be embedded in the data stream, be embedded in a clock stream, or even a separate signal, depending on the communications protocol. Each such time slot, for example, could be implemented to carry a separate HDLC channel of data.

Further, a time slot assigner (TSA) can be coupled in a microcontroller to an HDLC channel for slot-level placement of the HDLC data on the external communication path. Such a TSA determines the start of a programmed time slot relative to the frame sync. This could be to provide the HDLC data within a particular time slot, or to further implement some sort of protocol that employs its own time slots, such as the protocol used for ISDN. In the GCI protocol, a frame is subdivided into two 8-bit B channels and a 2-bit D channel, which form two separate 8-bit and one 2-bit "slot" within a communications frame on the GCI bus.

More generally, a time slot assigner (TSA) typically supports the isolation of 8-bit slots from 0 to 155 on a standard 8-kilohertz time division multiplexed (TDM) frame. This supports a variety of TDM buses, including GCI, E1, T1, PCM highway, and others. Of course, other length frames, other speeds, and other numbers of slots can be supported as well.

Support for multiple communications protocols has typically implied multiple clock sources are present. For a processor-based device, when a clock source from a number of clock sources must be selected for a clock line, clock glitches, unwanted signal transitions or edges on the clock line, often very short, have commonly occurred on the clock line during switching of a clock source to the clock line. The timing of processor-based devices thus has been susceptible to such clock glitches. Clock behavior has been particularly critical for processor-based devices that support multiple data communication protocols such as those described above.

SUMMARY OF THE INVENTION

A clock switching technique for a processor-based device allows selecting an input clock signal from two clock sources. A clock select signal controls a clock source selection logic that selects an input clock signal onto an output clock line. The two clock sources are asynchronous to each other and to the clock select signal. The output clock line is guaranteed to be glitch free. The technique is independent of the two clock source frequencies as well as the clock select signal frequency and the system clock frequency.

One advantage of this clock switching technique is that the circuit design is synchronous in nature and easy to implement. In a system that has multiple sources of clocks, this technique provides a flexible system, simplifying the design of the clock switching circuit. A further advantage is that the period of time after the clock source selection logic switch occurs can be scaled independently of the number of input clock sources. Further the clock selection technique works independently of the frequency of any of the clock sources or system clock frequency.

BRIEF DESCRIPTION OF THE DRAWINGS

A better understanding of the present invention can be obtained when the following detailed description of the preferred embodiment is considered in conjunction with the following drawings, in which:

FIG. 2b is a block diagram of an embodiment of an exemplary clock switching circuit C' as synthesized from a Verilog RTL description of the clock switching circuit C of FIG. 2a;

DETAILED DESCRIPTION OF INVENTION

Figure 1:
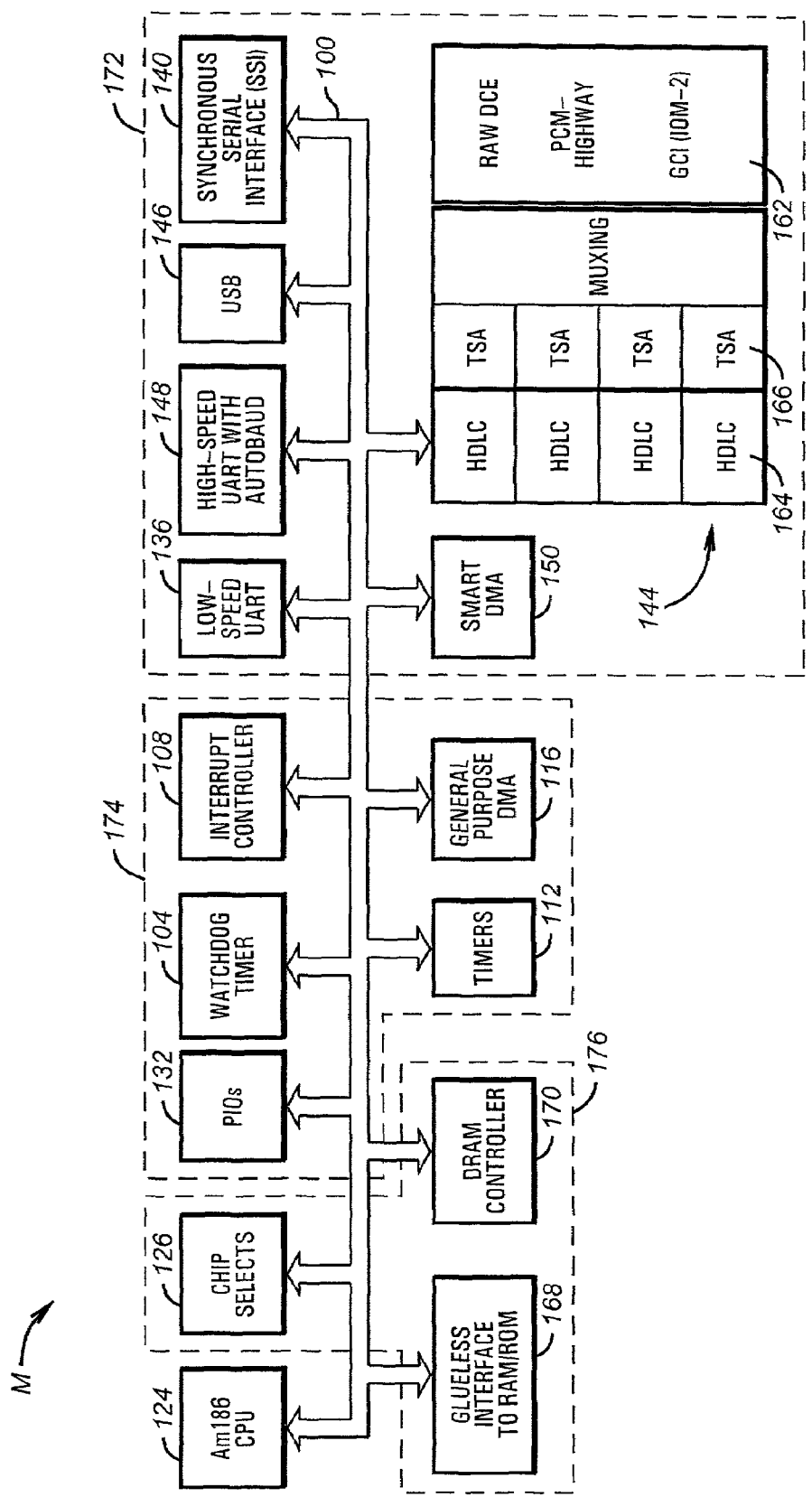
FIG. 1 is a block diagram of an exemplary microcontroller M containing an embodiment of the present invention.

Turning to FIG. 1, shown is a block diagram of a typical microcontroller M implemented according to the invention. Such a microcontroller is preferably implemented on a single monolithic integrated circuit.

The microcontroller M preferably includes an internal bus 100 coupling, an execution unit 124, system peripherals 174, memory peripherals 176 and serial communication peripherals 172. The execution unit 124 in the disclosed embodiment is compatible with the Am 186 instruction set implemented in a variety of microcontrollers from Advanced Micro Devices, Inc., of Sunnyvale, Calif. A variety of other execution units could be used instead of the execution unit 124. The system peripherals 174 include a watchdog timer (WDT) 104 for generating non-maskable interrupts (NMIs), microcontroller resets, and system resets. An interrupt controller 108 for supporting thirty-six maskable interrupt sources through the use of fifteen channels is also provided as a system peripheral. One disclosed system peripheral is a three-channel timer control unit 112. The timer control unit 112 includes three 16-bit programmable timers. Another system peripheral is a general-purpose direct memory access (DMA) unit 116 with four channels 0–3. A programmable I/O unit 132 of the microcontroller M supports user programmable input/output signal (PIOs). In the disclosed embodiment, forty-eight PIOs are provided.

The memory peripherals 176 of the disclosed microcontroller include a DRAM controller 170, a glueless interface 168 to a RAM or ROM, and a chip select unit 126. In the disclosed embodiment, the DRAM controller 170 is fully integrated into the microcontroller M. Also in the disclosed embodiment, the chip select unit 126 provides six chip select outputs for use with memory devices and eight chip select outputs for use with peripherals.

A low speed serial port implemented as a universal asynchronous receiver/transmitter (UART) 136 is provided as a serial communication peripheral. The low speed UART 136 is typically compatible with a standard 16550 UART known to the industry. Another serial communication peripheral in the disclosed embodiment is a synchronous serial interface (SSI) 140. Preferably the microcontroller M acts as a master in the synchronous serial interface 140, which is a standard synchronous serial channel.

The microcontroller M in the disclosed embodiment is particularly well suited to communications environments. To this end, the serial communication peripherals 172 of the microcontroller M include a number of high speed communication controllers, including a High-level Data Link Control (HDLC) controller 144, a Universal Serial Bus (USB) controller 146, and a high speed serial port (HSUART) 148. The disclosed HDLC controller 144 provides four HDLC channels 164. The HDLC channels 164 and the USB controller 146 can be written to and read from by a "SmartDMA" unit 150, a unit which provides for chained buffers that are accessed via pairs of DMA channels. The SmartDMA unit 150 allows for a high degree of packetized transfer without excessive execution unit 124 intervention. The SmartDMA unit 150 preferably consists of four SmartDMA controllers, SmartDMA0-3, that each consists of a pair of DMA channels.

The HSUART 148 serves to form an asynchronous serial link across a bus to devices external to the microcontroller M. The asynchronous nature indicates that the HSUART 148 does not provide a separate clock signal to clock the data. Instead the rate at which data is sent and received must be predetermined or determined through autobauding and independently controlled on sending and receiving ends. This data rate is known as the baud rate. It should be understood that the microcontroller M may include multiple HSUARTs 148.

The disclosed HDLC controller 144 also includes an interface multiplexer 162. This multiplexer 162 couples the four HDLC channels 164, four time slot assigners (TSA) 166, and a number of external buses. Specifically, using the time slot assigners or otherwise, the HDLC channels 164 can be selectively coupled to a pulse code modulation (PCM) highway, a general circuit interface (GCI), a data carrier equipment (DCE) serial interface, and other general and specific external communication interfaces that often use packetized communication. Further, the HDLC channels 164 support HDLC, SDLC, Link Access Procedures Balanced (LAPB), Link Access Procedures on the D-channel (LAPD), and PPP, and as noted above, each include an independent time slot assigner 166 for assigning a portion of a serial frame to each HDLC for isochronous communication.

The techniques and circuitry according to the invention could be applied to a wide variety of microcontrollers and other similar environments. The term "microcontroller" itself has differing definitions in industry. Some companies refer to a processor core with additional features (such as I/O) as a "microprocessor" if it has no onboard memory, and digital signal processors (DSPs) are now used for both special and general-purpose controller functions. As here used, the term "microcontroller" covers all of the products, and generally means an execution unit with added functionality all implemented on a single monolithic integrated circuit.

Figure 2A:
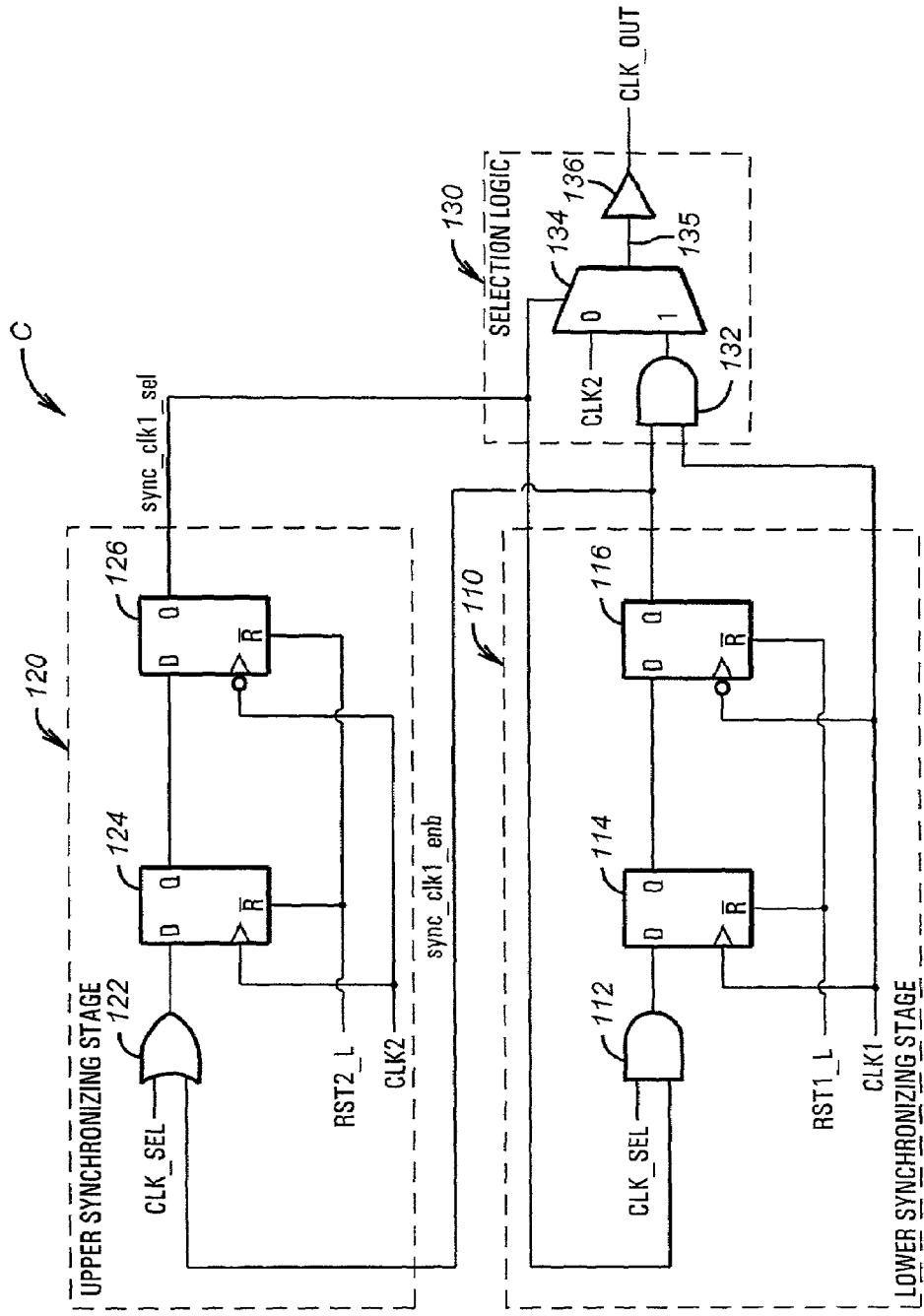
FIG. 2a is a block diagram of an embodiment of an exemplary clock switching circuit C contained in the microcontroller M of FIG. 1.

Turning to FIG. 2a, a block diagram is shown of an exemplary embodiment of a clock switching circuit C contained in the microcontroller M. One skilled in the art will recognize that the microcontroller M can contain multiple clock switching circuits C without departing from the spirit of the invention.

A first clock signal CLK1 is connected to a first clock source. A second clock signal CLK2 is connected to a second clock source. The CLK1 and CLK2 signals are asynchronous to each other. CLK1 and CLK2 can have any phase and frequency relationship to each other useful for the microcontroller M. In other words, CLK1 can have a frequency that is lower, higher, or the same as CLK2, and CLK1 can be in phase or out of phase with CLK2.

A CLK_SEL signal is used to indicate which of CLK1 or CLK2 is to be selected onto the CLKOUT line. The CLK_SEL signal is also asynchronous to the CLK1 and CLK2 signals. In one embodiment, the CLK_SEL signal is implemented as a user programmable bit that can dynamically be changed under software control. In another embodiment, the CLK_SEL signal is a signal generated from another logic block.

A first system reset signal RST1_L and a second system reset signal RST2_L can be used to reset flip-flops 114–116 and 124–126, respectively, to prevent meta-stability of the clock switch mechanism. The RST1_L signal is synchronous with the CLK1 signal and the RST2_L signal is synchronous with the CLK2 signal. The synchronization of the RST1_L signal with the CLK1 signal and the synchronization of the RST2_L signal with the CLK2 signal are not shown.

The CLKOUT output clock line is the output signal onto which one of the CLK1 signal or the CLK2 signal is selected depending upon the value of the CLK_SEL signal. In one embodiment, a buffer 136 buffers an internal clock line 135 onto the CLKOUT line. The buffer 136 can be implemented based on a predetermined timing requirement, such as a clock skew goal using any method of clock tree synthesis or clock layout requirement of the design.

The clock switching circuit of FIG. 2a contains three blocks. Block 110 (lower synchronization stage) synchronizes the CLK_SEL signal with the CLK1 signal. Block 120 (upper synchronization stage) synchronizes the CLK_SEL signal with the CLK2 signal. Each of the synchronization stages uses a feedback signal generated by the other synchronization stage to perform the synchronization by gating the CLK_SEL signal and the feedback signal together. The effect is to synchronize the CLK_SEL signal with both of the CLK1 and CLK2 signals, without any required frequency or phase relationship between any of CLK_SEL, CLK1, or CLK2. In addition, the feedback signal of the upper synchronization stage is used to trigger the selection logic of Block 130, which selects one of the CLK1 or CLK2 signals onto the CLKOUT line. The output feedback signal of the lower synchronization stage is also used to gate the CLK1 signal input to the selection logic of Block 130.

Block 110 contains an AND gate 112 and two flip-flops 114 and 116. Block 120 contains an OR gate and two flip-flops 124 and 126. One skilled in the art will recognize that blocks 110 and 120 are scalable by adding additional flip-flops in series with flip-flops 114–116 and 124–126 to achieve any desired delay between a change in the CLK_SEL signal and switching the signal gated to the CLKOUT signal.

As shown in FIG. 2a, block 130 contains an AND gate 132 connected to the output of flip-flop 116 and the CLK1 signal. Further, a multiplexer 134 is connected to the output of the AND gate 132 and the CLK2 signal, switching those inputs onto the CLKOUT line. As shown in FIG. 2a, the output of multiplexer 134 is an internal clock 135, which is input to a buffer 136, producing a buffered output clock line CLKOUT. One skilled in the art will recognize that the block 130 can be implemented without the buffer 136 or with multiple levels of buffering using buffer 136 of varying drive sizes and strength to achieve clock timing goals of the chip. The multiplexer 134 is switched under the control of a sync_clk1_sel signal. As shown in FIG. 2a, switching of multiplexer 134 is effected only when both inputs of the multiplexer 134 are low. One skilled in the art will recognize that switching can also be effected when both inputs of the multiplexer 134 are high by changing the polarity of each of the blocks 110 and 120.

Flip-flops 114 and 124 are triggered off of the positive or rising edge of the CLK1 signal and CLK2 signal, respectively. Likewise, flip-flops 116 and 126 are triggered off the negative or falling edge of the CLK1 signal and the CLK2 signal, respectively. The output of the flip-flop 116 is a sync_clk1_enb feedback signal, which is used as an input to the OR gate 122 in block 120. The output of the flip-flop 126 is a sync_clk1_sel feedback signal which is used as an input signal to the AND gate 112. The sync_clk1_enb signal, together with the CLK1 signal, is also input to AND gate 132 in the selection block 130. The sync_clk1_sel signal is also used to trigger the multiplexer 134 of the selection logic 130.

Figure 2B:
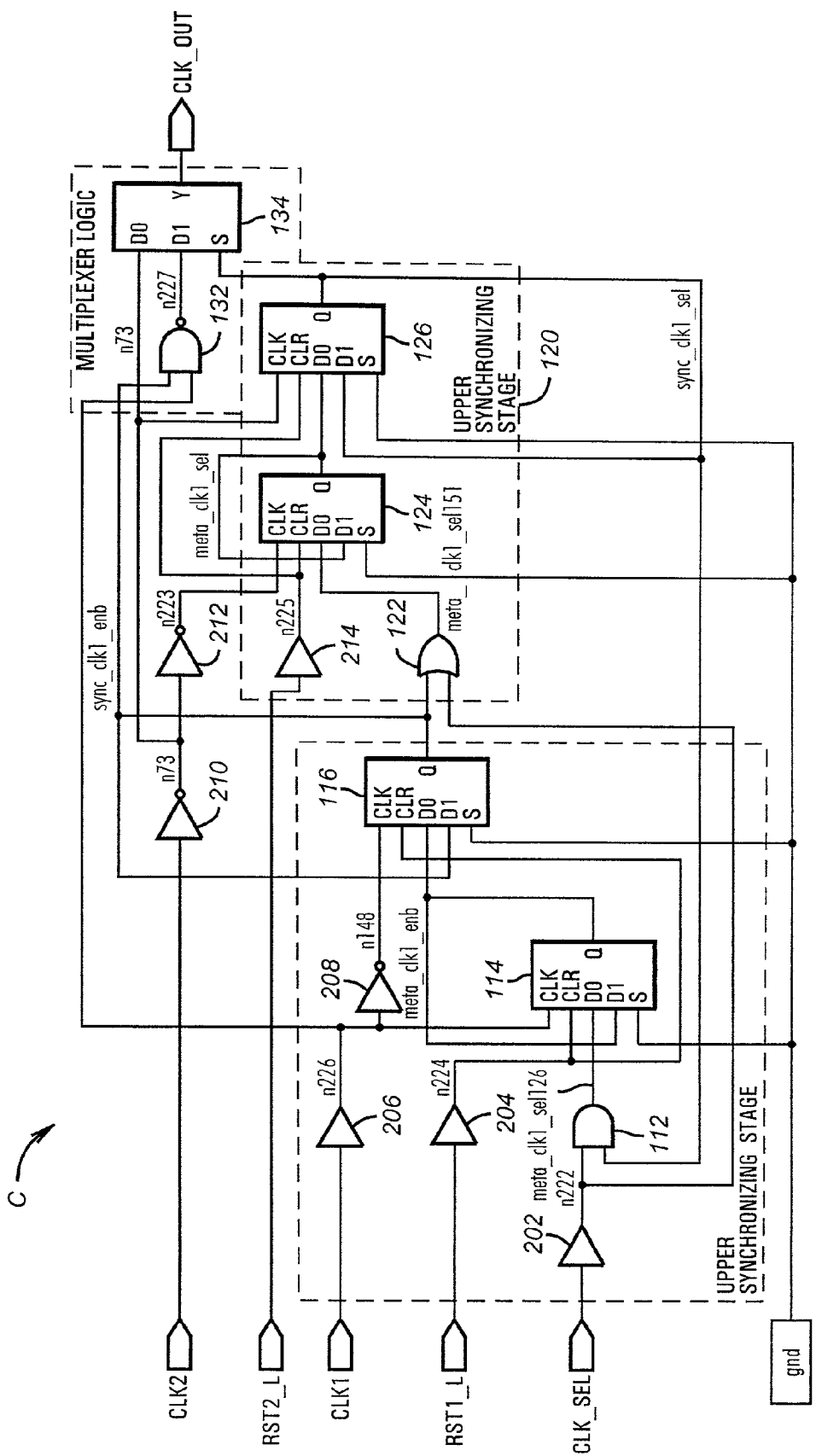
Figure 2C:
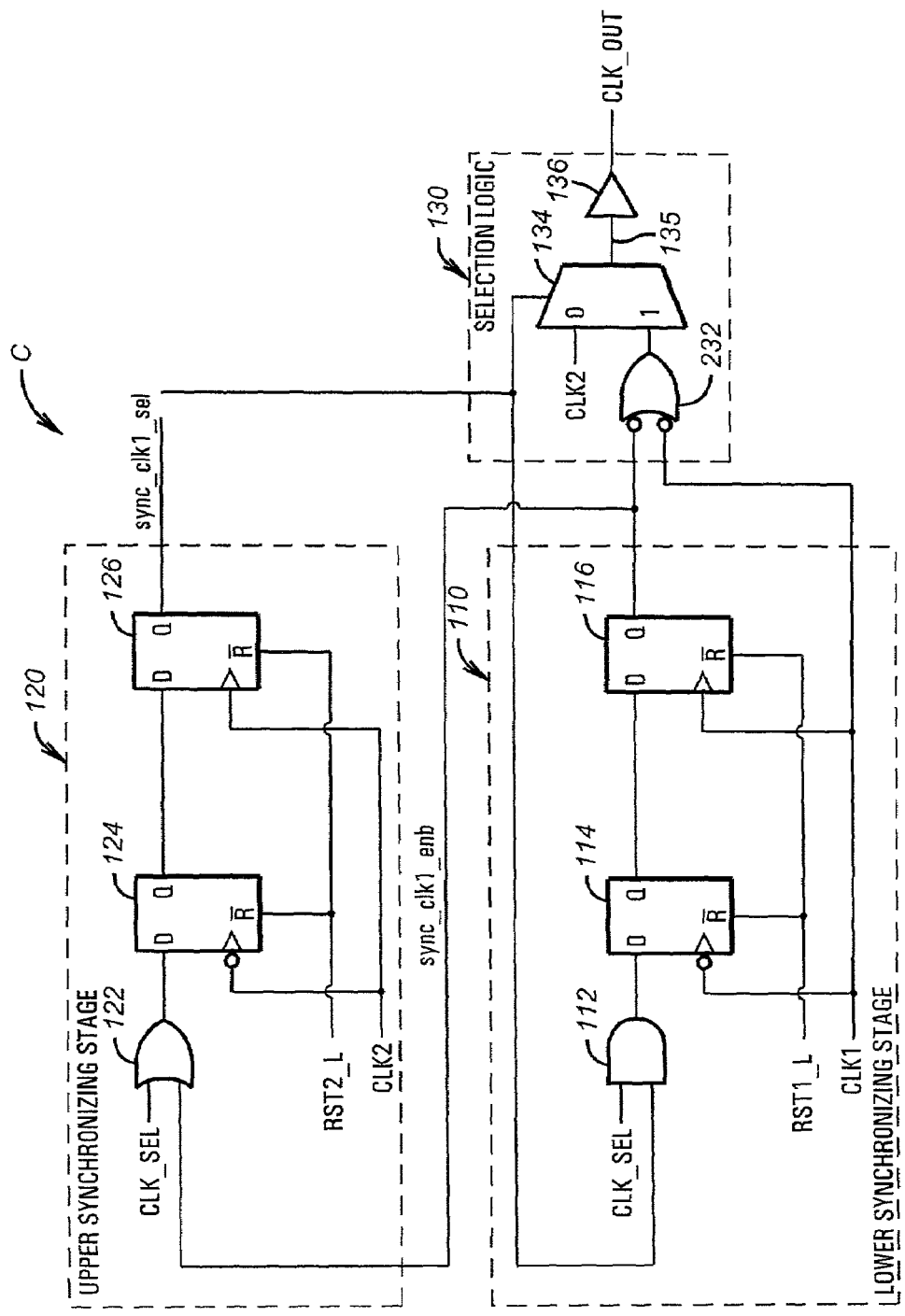
FIG. 2c is a block diagram of an embodiment of the exemplary clock switching circuit C of FIG. 2a, using a different polarity.

FIG. 2c shows an alternate configuration in which flip-flops 114 and 124 are triggered off of the negative or falling edge of the CLK1 signal and CLK2 signal, respectively, and where flip-flops 116 and 126 are triggered off of the positive or rising edge of the CLK1 signal and the CLK2 signal, respectively. In addition, a NAND gate 232 is used instead of the AND gate of FIG. 2a.

In the following, the terms deasserted low, deasserted high, asserted low, and asserted high are used. One skilled in the art will recognize that the term deasserted low describes a signal that is in a logical OFF state when at a low voltage level. The term deasserted high describes a signal that is in a logical OFF state when at a high voltage level. Likewise, the term asserted low describes a signal that is in a logical ON state when at a low voltage level and the term asserted high describes a signal that is in a logical ON state when at a high voltage level. Conventionally, the term asserted without a modifier indicates a signal that is in a logical ON state when at a high voltage level, i.e., asserted high. Likewise, the term deasserted without a modifier indicates a signal that is in a logical OFF state when at a low voltage level, i.e., deasserted low.

Figure 5:
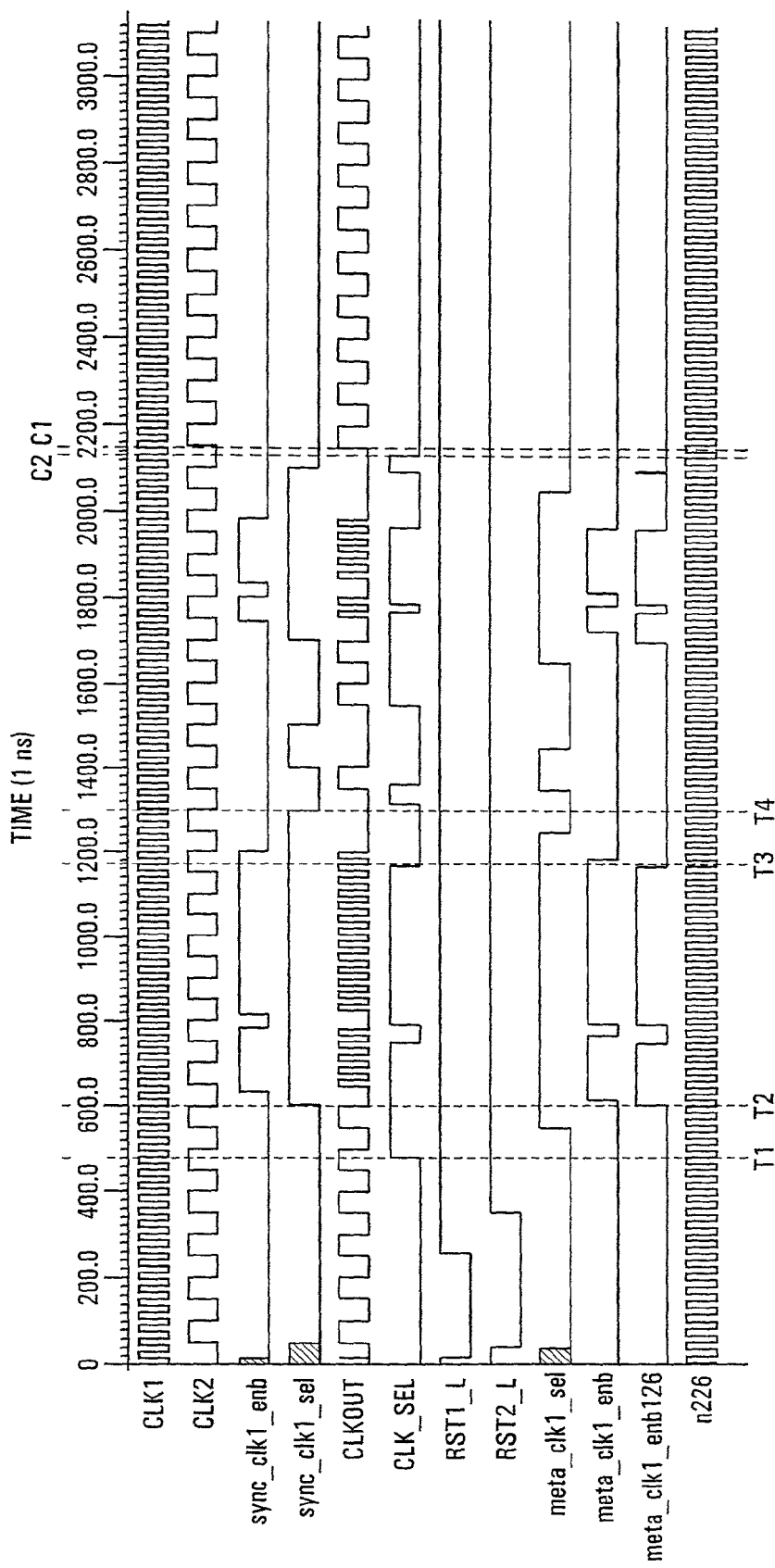
FIG. 5 is a timing diagram for switching between clock signals using the exemplary clock switching circuit of FIG. 2b where the first clock frequency is higher than the second clock frequency.

When CLK_SEL is asserted high, the sync_clk1_sel signal, which is always asserted at the negative edge of CLK2, will be high after at least half a CLK2 cycle later. During this time, the CLK2 signal is in a low state. For example, in FIG. 5 at time T1, the CLK_SEL signal is asserted high. As can be seen in the timing diagram, the sync_clk1_sel signal is then asserted at time T2, in this case a little over one complete CLK2 cycle later, at the negative edge of CLK2. The clock-to-Q delay of the flip-flop 126, whose output controls the select line of the multiplexer 134, is typically much greater than the cell and interconnect delays, hence no race condition could happen between the select and input signals of the multiplexer 134. This is because both inputs to the multiplexer 134 are asserted low prior to when the sync_clk1_sel signal changes its value. In FIG. 5, at time T2, all of the CLK1, CLK2, and sync_clk1_enb signals are in a low state, thus both inputs to the multiplexer 134 are in the low state. Both inputs of the multiplexer 134 are guaranteed to be asserted low whenever sync_clk1_sel changes, therefore no glitches occur on the CLKOUT output line. Because sync_clk1_enb is still asserted low, CLK1 will not be gated onto CLKOUT while CLKOUT remains asserted low. As can be seen at time T2 in FIG. 5, the CLK1 feedback signal sync_clk1_enb will be guaranteed to stay deasserted low at least half a CLK1 cycle after sync_clk1_sel is asserted high. Signal sync_clk1_enb, which is always asserted on a negative edge of CLK1, will guarantee that CLK1 is switched onto CLKOUT at the next rising edge of the CLK1 signal. Therefore, no glitch can occur on the CLKOUT line.

When the CLK_SEL signal is asserted low, in FIG. 5 at time T3, the sync_clk1_sel will stay asserted high because the sync_clk1_enb signal is asserted high, thereby ensuring that CLK1 is still selected after at least half a CLK1 period. After the CLK_SEL signal is asserted low asynchronously to either the CLK1 or CLK2 signals, sync_clk1_enb will be deasserted low, in gating CLK1 onto the CLKOUT output line. When sync_clk1_enb switches to low, CLKOUT is already at the low cycle of CLK1, therefore no glitch can occur on the CLKOUT output line, because the CLK to Q delay of flip-flop 116 is greater than the cell and interconnect delay of the CLK1 signal at the input of AND gate 132. Signal sync_clk1_sel is asserted high for at least half a CLK2 period after sync_clk _enb is deasserted low. Again, sync_clk1_sel is deasserted low when both the inputs of the multiplexer are low, in FIG. 5 at time T4, guaranteeing that the CLKOUT signal is glitch free during the switching period.

A clock switching mechanism according to the disclosed embodiment is not dependent on the frequency and phase of the two clock sources and is guaranteed to work for any phase or frequency relationship between the two clock sources. During a clock switch indicated by the CLK_SEL signal, the CLKOUT signal will continue to remain low after the last clock low of the previous clock for at least half a period of the new clock.

Also, the disclosed embodiment is robust in that it can tolerate glitches on the CLK_SEL line and guarantees the clock switching circuit C will work correctly because the CLKOUT signal is glitch free and only flip-flop outputs are used to control gating and selection of the multiplexer 134 whenever both its inputs are low.

Provided below is exemplary hardware description code (in this case, Verilog RTL (Register Transfer Level)) for the clock switching circuit of FIG. 2a, along with a table providing general descriptions for the variables within the code. Those skilled in the art will readily relate and correlate the table and code below with the other disclosure provided herein. It should be apparent to those skilled in the art that other implementations of the clock switching circuit are possible.

| Variable Name | Description |
| --- | --- |
| CLK1 | System clock 1 |
| CLK2 | System clock 2 |
| CLK_SEL | Asynchronous clock select ("1" = CLK1, "0" = CLK2) |
| RST1_L | System reset synchronized to CLK1 |
| RST2_L | System reset synchronized to CLK2 |
| CLK_OUT | Output global clock |
| meta_clk1_sel | First stage sync mux select |
| sync_clk1_sel | Synchronized mux select line |
| meta_clk1_enb | First stage sync CLK1 enable |
| sync_clk1_enb | Synchronized CLK1 enable |

```
module clksw (CLK1, CLK2, CLK_SEL, RST1_L, RST2_L,
CLK_OUT);
input    CLK1;
input    CLK2;
input    CLK_SEL;
input    RST1_L;
input    RST2_L;
output   CLK_OUT;
reg      meta_clk1_sel;
reg      sync_clk1_sel;
reg      meta_clk1_enb;
reg      sync_clk1_enb;
always @(posedge CLK2 or negedge RST2_L)
begin
    if (~RST2_L)
        meta_clk1_sel <= 1'b0;
    else
        meta_clk1_sel <= (CLK_SEL | sync_clk1_enb);
end
always @(negedge CLK2 or negedge RST2_L)
begin
    if (~RST2_L);
        sync_clk1_sel <= 1'b0;
    else
        sync_clk1_sel <= meta_clk1_sel;
end
always @(posedge CLK1 or negedge RST1_L)
begin
    if (~RST1_L)
        meta_clk1_enb <= 1'b0
    else
        meta_clk1_enb <= (CLK_SEL & sync_clk1_sel);
end
always @(negedge CLK1 or negedge RST1_L)
begin
    if (~RST1_L)
        sync_clk1_enb <= 1'b0;
    else
        sync_clk1_enb <= meta_clk1_enb;
end
assign CLK_OUT = (sync_clk1_sel) ? (CLK1 &
sync_clk1_enb) : CLK2;
endmodule
```

The above Verilog RTL can be synthesized using a cell based array library or any standard cell library to realize the gate implementation of a disclosed embodiment as shown in FIG. 2b. Buffers and inverters 202–214 are artifacts of the synthesization technique of the cell based array library and one skilled in the art will recognize that other Verilog RTL synthesization techniques could be used to produce logically equivalent synthesizations with different numbers of buffers and inverters without departing from the spirit of the invention. Logic 112–116, 122–126, and 132–134 of FIG. 2b are of like structure and function as the logic described in connection with FIG. 2a bearing the same reference numerals.

Figure 3:
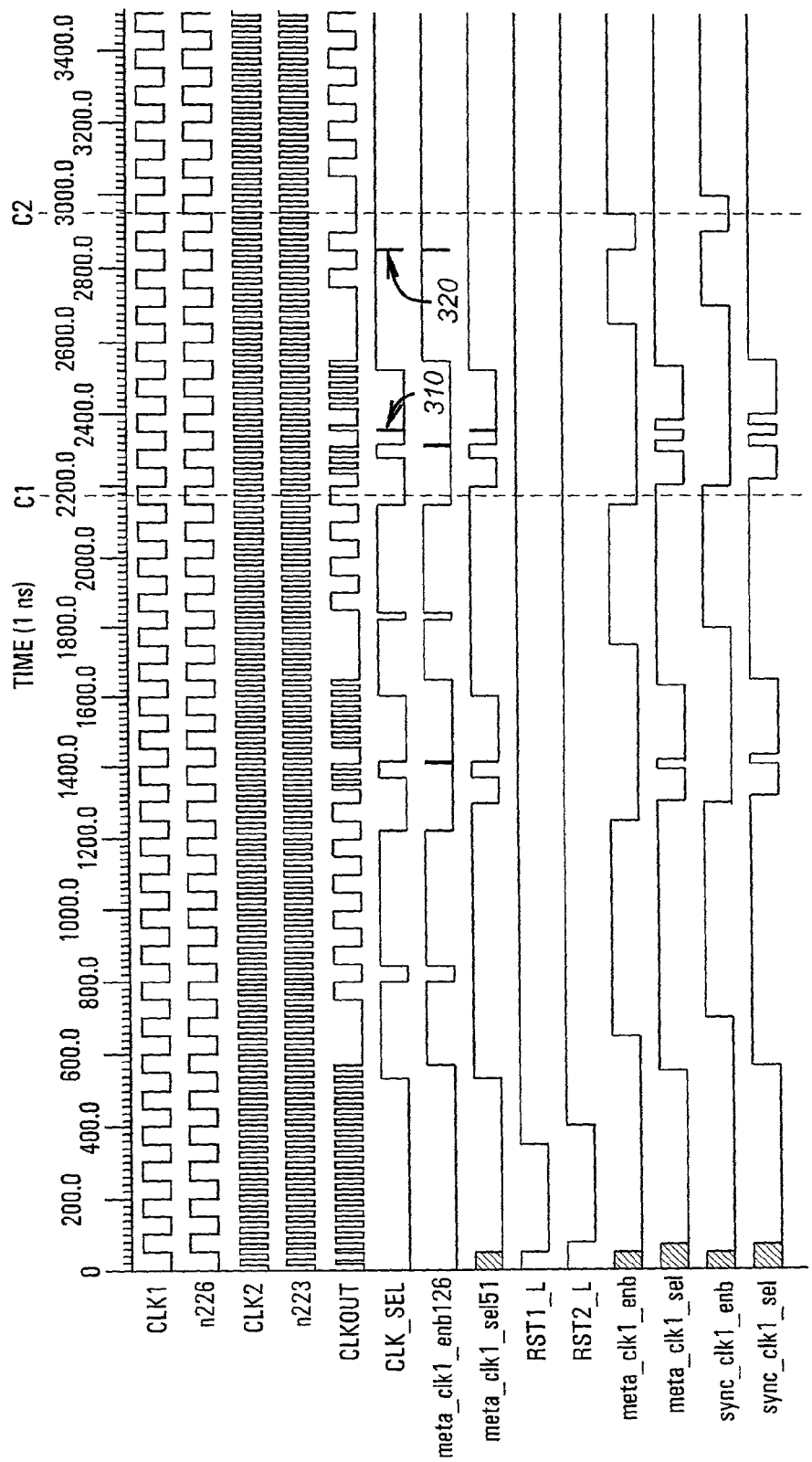
FIG. 3 is a timing diagram for switching between clock signals using the exemplary clock switching circuit of FIG. 2b where the first clock frequency is lower than the second clock frequency.
Figure 4:
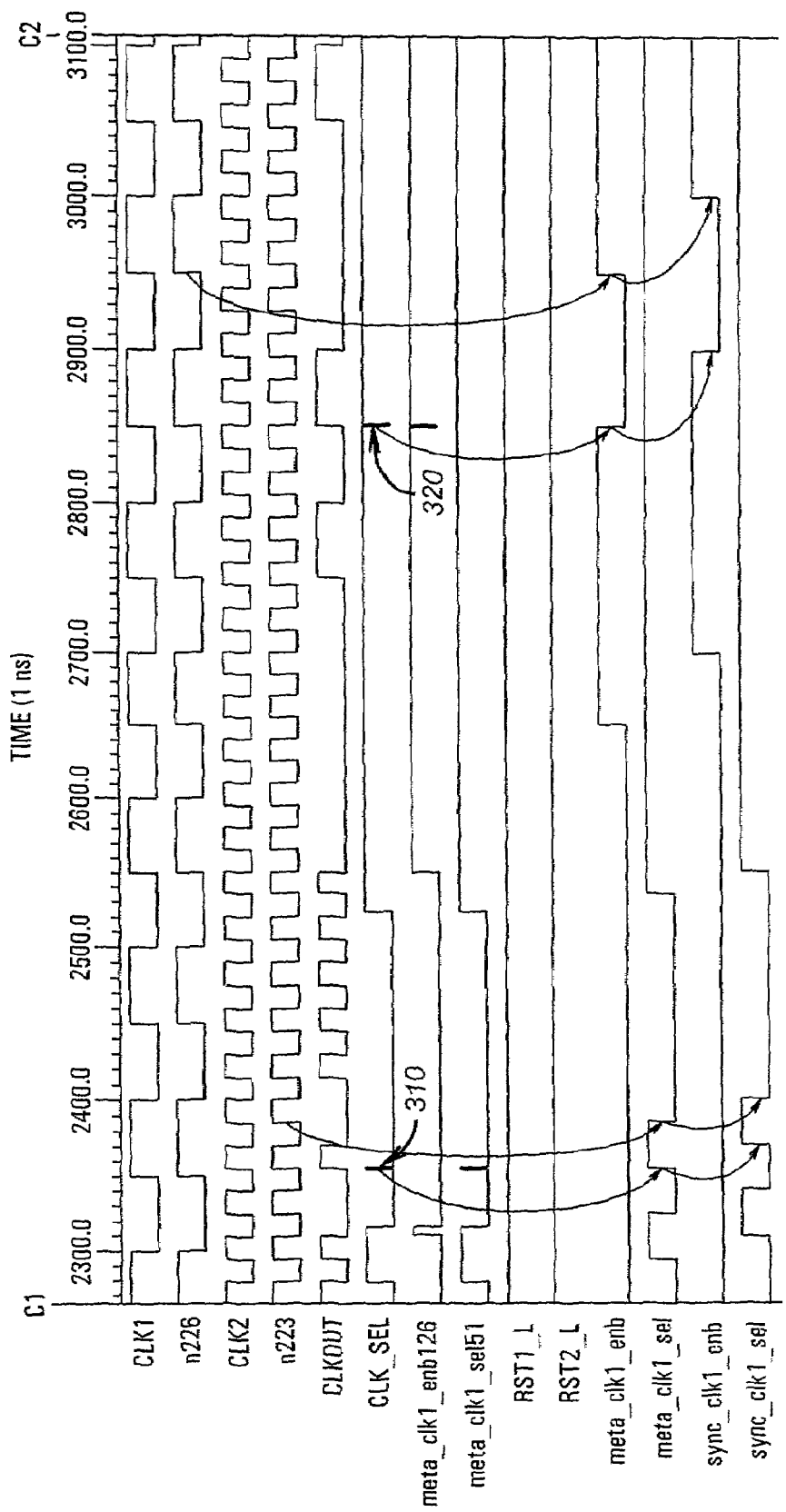
FIG. 4 is an expanded view of the timing diagram of FIG. 3.

FIGS. 3–5 are timing diagrams showing the effect of injection of glitches into a circuit constructed according to the synthesization as shown in FIG. 2b. FIG. 3 is a timing diagram for an embodiment where CLK1 has a lower frequency than CLK2. Signal n226 is a buffered version of signal CLK1. Likewise, signal n223 is a buffered version of signal CLK2 that has been passed through inverters 210 and 222. Signal meta_clk1_enb126 shows the output of AND gate 112. Signal meta_clk1‾sel51 shows the output of OR gate 122. Signal meta_clk1_enb shows the output signal from flip-flop 114, which is connected to the D0 input of flip-flop 116. Signal meta_clk1_sel is the output of flip-flop 124, which is connected to the input D0 of flip-flop 126. As can be seen in FIG. 3, the initial blackened areas of the CLKOUT signal are in an unknown state because the flip-flops 114–116 and 124–126 have not been reset. Likewise, the blackened areas of signals meta_clk1_sel51, meta_clk1_enb, meta_clk1_sel, sync_clk1_enb, and sync_clk1_sel indicate that the status of those signals is unknown because the flip-flops 114–116 and 124–126 have not been reset. FIG. 3 shows 2 ns (nanosecond) glitches on the CLK_SEL signal injected at the capturing edge of both CLK1 and CLK2. These glitches violate the setup or hold time of the synchronizing flip-flops 114 and 124 in upper and lower synchronization stages 120 and 110, respectively. Glitch 310 is a positive going 2 ns glitch. In this case, it can be seen that CLKOUT did not glitch and CLKOUT tracked CLK2 correctly with an additional one CLK2 period of "low stretch" (i.e., staying in a low state for an additional length of time) introduced because the circuit was resolving the glitch 310, due to the sync_clk1_sel signal being asserted high forte CLK2 period.

Likewise, injecting a 2 ns glitch precisely introduced at the positive capturing edge of CLK1 for the lower synchronizing stage 110 flip-flops 114–116 is shown as glitch 320. Glitch 320 violates the setup time of the flip-flops 114–116. As can be seen in FIG. 3, again there is no glitch on the CLKOUT signal and an extra CLK1 period "low stretch" is introduced because the circuit was resolving the glitch seen, due to the sync_clk1_enb signal being asserted low for one CLK1 period.

FIG. 4 is an expanded view of the time period between time C1 and time C2 of FIG. 3, making it easier to see the effect of introducing glitches 310 and 320 onto the CLK_SEL signal. As can be seen clearly in FIG. 4, the effect of the 2 ns glitch is to force the CLKOUT signal into the low state for an extra CLK2 period (in the case of glitch 310) or an extra CLK1 period (in the case of glitch 320). As can be observed from FIG. 4, the disclosed embodiment does not erroneously introduce any additional clock edges on the CLKOUT line, thereby further insuring that the CLKOUT line is glitch free and guaranteeing the stability of the design.

FIG. 5 is a timing diagram showing similar transactions in an embodiment where the frequency of the CLK1 signal is higher than the frequency of the CLK2 signal. One skilled in the art will recognize that glitches introduced into the CLK_SEL signal in the embodiment shown in FIG. 5 will result in the same holding of the CLKOUT signal low for one additional period as was seen in FIG. 4.

One advantage of this clock switching technique is that the circuit design is synchronous in nature and easy to implement. In a system that has multiple sources of clocks, this technique provides a flexible system, simplifying the design of the clock switching circuit. A further advantage is that the period of time between the clock source selection signal change and the output clock signal change can be scaled independently of the frequencies of the input clock sources. Further, the clock selection technique works independently of the frequency of any of the clock sources or system clock frequency.

Those skilled in the art will appreciate that the disclosed clock switching circuitry can be implemented in a schematic-based design or in a hardware description language such as Verilog or VHDL or any other form of design entry. Further, it should be understood that the disclosed clock switching techniques can be applied to a variety of processor-based devices other than microcontrollers.

The foregoing disclosure and description of the various embodiments are illustrative and explanatory thereof, and various changes in the components, circuit elements, code elements, hardware description language, variables, data types, signals, and wiring connections, as well as in the details of the illustrated circuitry and construction and method of operation may be made without departing from the spirit of the invention.

The invention claimed is:

1. A clock selection device adapted to select one of a pair of clock sources onto an output clock line, comprising:
   a first input clock line coupled to a first clock source;
   a second input clock line coupled to a second clock source, the second clock source asynchronous to the first clock source;
   a clock selection logic adapted to select from the first input clock line and the second input clock line, producing an internal clock line coupled to the output clock line; and
   a clock synchronization logic coupled to the first input clock line, the second input clock line, and the clock selection logic, adapted to synchronize the first input clock line, the second input clock line, and the clock selection logic, such that the internal dock line is glitch free, the clock synchronization logic triggering the clock selection logic to select from the first input clock line and the second input clock line, the clock synchronization logic comprising:
      an OR gate coupled to a clock select line and an internal feedback line of the clock synchronization logic;
      a first plurality of flip-flops coupled to the output of the OR gate and the second input clock line, producing a clock switch line adapted to cause the clock selection logic to switch between the first clock source and the second clock source;
      an AND gate coupled to the clock select line and the clock switch line; and
      a second plurality of flip-flops coupled to the output of the AND gate and the first input clock line, the output of the second plurality of flip-flops coupled to the internal feedback line,
   wherein the clock synchronization logic is independent of the internal clock line,
   wherein the first clock source has a first frequency, and
   wherein the second clock source has a second frequency, the second frequency independent of the first frequency.

2. The clock selection device of claim 1, the clock synchronization logic comprising:
   a first clock synchronization block, coupled to the first clock source, adapted to synchronize the first clock source and the clock selection logic; and
   a second clock synchronization block, coupled to the second clock source, adapted to synchronize the second clock source and the clock selection logic.

3. The clock selection device of claim 2, the clock synchronization logic further comprising;
   a first clock reset signal, synchronized to the first clock signal, adapted to reset the first clock synchronization block; and
   a second clock reset signal, synchronized to the second clock signal, adapted to reset the second clock synchronization block,
   wherein the first clock reset signal and the second clock reset signal can be asserted to prevent meta-stability of the clock synchronization logic.

4. The clock selection device of claim 1, wherein the clock synchronization logic is scalable to produce a predetermined delay time between the assertion of the clock select signal and the selection onto the output line by the clock selection logic.

5. The clock selection device of claim 1, wherein the clock selection logic comprises a multiplexer with two clock input lines.

6. The clock selection device of claim 5, wherein the multiplexer switches only when both clock input lines of the multiplexer are at the same assertion level.

7. The clock selection device of claim 1, further comprising:
   a clock selection signal, asynchronous to the first clock source and the second clock source, adapted to cause the clock selection logic to select one of the first input clock source and the second input clock source onto the internal clock line, selecting the first input clock source when the clock selection signal is asserted and the second input clock source when the clock selection signal is deasserted.

8. The clock selection device of claim 1, the clock selection logic comprising:
an AND gate coupled to the internal feedback line and the first input clock line.

9. The clock selection device of claim 1, the clock synchronization logic further comprising:
an inverter coupled to the first input clock line producing an inverted first input clock line coupled to the first plurality of flip-flops; and
an inverter coupled to the second input clock line producing an inverted second input clock line coupled to the second plurality of flip-flops; and
the clock selection logic comprising:
a NAND gate coupled to the internal feedback line and the inverted first input clock line.

10. The clock selection device of claim 1, further comprising:
a buffer coupled to the internal clock line, producing a buffered output clock signal.

11. A processor-based device comprising:
a processor
a plurality of communication controllers coupled to the processor, each of the plurality of communication controllers comprising:
a first clock source;
a second clock source asynchronous to the first clock source; and
a clock selection device coupled to the first clock source and the second clock source comprising:
a first input clock line coupled to the first clock source;
a second input clock line coupled to the second clock source; and
a clock selection logic adapted to select from the first input clock line and the second input clock line, producing an internal clock line; and
a clock synchronization logic coupled to the first input clock line, the second input clock line, and the clock selection logic, adapted to synchronize the first input clock line, the second input dock line, and the clock selection logic, such that the internal clock line is glitch free, the clock synchronization logic triggering the clock selection logic to select from the first input clock line and the second input clock line, the clock synchronization logic comprising:
an OR gate coupled to a clock select line and an internal feedback line of the clock synchronization logic;
a first plurality of flip-flops coupled to the output of the OR gate and the second input clock line, producing a clock switch line adapted to cause the clock selection logic to switch between the first clock source and the second clock source;
an AND gate coupled to the clock select line and the clock switch line; and
a second plurality of flip-flops coupled to the output of the AND gate and the first input clock line, the output of the second plurality of flip-flops coupled to the internal feedback line,
wherein the clock synchronization logic is independent of the internal clock line,
wherein the first clock source has a first frequency, and wherein the second clock source has a second frequency, the second frequency independent of the first frequency.

12. The processor-based device of claim 11, the clock synchronization logic comprising:
a first clock synchronization block, coupled to the first clock source, adapted to synchronize the first clock source and the clock selection logic;
a second clock synchronization block, coupled to the second clock source, adapted to synchronize the second clock source and the clock selection logic.

13. The processor-based device of claim 12, the clock synchronization logic further comprising:
a first dock reset signal, synchronized to the first clock signal, adapted to reset the first clock synchronization block; and
a second clock reset signal, synchronized to the second clock signal, adapted to reset the second clock synchronization block,
wherein the first clock reset signal and the second clock reset signal can be asserted to prevent meta-stability of the clock synchronization logic.

14. The processor-based device of claim 11, wherein the clock synchronization logic is scalable to produce a predetermined delay time between the assertion of the clock select signal and the selection onto the output line by the clock selection logic.

15. The processor-based device of claim 11, wherein the clock selection logic comprises a multiplexer with two input lines.

16. The processor-based device of claim 15, wherein the multiplexer switches only when both input lines of the multiplexer are at the same assertion level.

17. The processor-based device of claim 11, the clock selection device further comprising:
a clock selection signal, asynchronous to the first clock source and the second clock source, adapted to cause the clock selection logic to select one of the first input clock source and the second input clock source onto the internal clock line, selecting the first input clock source when the clock selection signal is asserted and the second input clock source when the clock selection signal is unasserted.

18. The processor-based device of claim 11, the clock selection logic comprising:
an AND gate coupled to the internal feedback line and the first input clock line.

19. The processor-based device of claim 11, the clock synchronization logic further comprising:
an inverter coupled to the first input clock line producing an inverted first input clock line coupled to the first plurality of flip-flops; and
an inverter coupled to the second input clock line producing an inverted second input clock line coupled to the second plurality of flip-flops; and
the clock selection logic comprising:
a NAND gate coupled to the internal feedback line and the inverted first input clock line.

20. The processor-based device of claim 11, the clock selection device further comprising:
a buffer coupled to the internal clock line, producing a buffered output clock signal on the output clock line.

21. A method of selecting one of a pair of clock sources onto a single output clock line, comprising the steps of:
(a) receiving a first input clock signal from a first clock source;

(b) receiving a second input clock signal from a second clock source, the second input clock signal asynchronous to the first input clock signal;
(c) connecting one of first clock signal or the second clock signal to an internal clock line coupled to the output clock line; and
(d) synchronizing the first input clock signal, the second input clock signal, and step (c), such that the output clock line is glitch free, comprising the steps of:
  ORing a clock select signal and an internal feedback signal;
  producing a clock switch signal adapted to trigger the performance of step (c) as a result of the step of ORing the clock select signal and the internal feedback signal;
  ANDing the clock select signal and the clock switch signal; and
coupling the result of the step of ANDing the clock select signal and the clock switch signal to the internal feedback signal,
wherein step (d) is performed independent of the output clock line,
wherein step (d) triggers the performance of step (c),
wherein the first clock source has a first frequency, and
wherein the second clock source has a second frequency, the second frequency independent of the first frequency.

22. The method of claim 21, furthering comprising the step of:
  buffering the internal clock line to generate the output clock line.
23. The method of claim 21, the step of synchronizing comprising the step of:
  delaying step (c) for a predetermined amount of time.
24. The method of claim 21, the step of synchronizing comprising the steps of:
  resetting a synchronization logic with a first reset signal synchronous to the first clock signal; and
  resetting the synchronization logic with a second reset signal synchronous to the second clock signal.
25. The method of claim 21, step (c) comprising the steps of:
  (c1) receiving a clock select signal asynchronous to the first clock signal and the second clock signal; and
  (c2) connecting the first clock signal to the output clock line when the clock select signal is asserted;
  (c3) connecting the second clock signal to the output clock line when the clock select signal is deasserted;
  step (d) comprising the step of;
  (d) synchronizing the first input clock signal, the second input clock signal, and steps (c2) and (c3), such that the output clock line is glitch free.

* * * * *